United States Patent
Ahn et al.

(10) Patent No.: US 8,862,082 B2
(45) Date of Patent: Oct. 14, 2014

(54) METHOD OF MODULATION AND DEMODULATION FOR NANO COMMUNICATION, AND RECEIVER USING THE METHOD

(71) Applicant: Samsung Electronics Co., Ltd., Suwon-si (KR)

(72) Inventors: Hyun Gi Ahn, Seoul (KR); Jong Bu Lim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/775,815

(22) Filed: Feb. 25, 2013

(65) Prior Publication Data
US 2013/0225104 A1 Aug. 29, 2013

(30) Foreign Application Priority Data
Feb. 27, 2012 (KR) .................. 10-2012-0019649

(51) Int. Cl.
*H04B 1/18* (2006.01)
*H03D 3/34* (2006.01)
*H04B 1/16* (2006.01)
*H03D 3/30* (2006.01)

(52) U.S. Cl.
CPC .. *H04B 1/16* (2013.01); *H03D 3/34* (2013.01); *H03D 3/30* (2013.01); *Y10S 977/953* (2013.01)
USPC ..... 455/193.2; 455/290; 455/334; 455/550.1; 977/953

(58) Field of Classification Search
USPC ............ 455/127.1, 142, 150.1, 179.1, 182.1, 455/193.1–193.3, 280–282, 290, 291, 313, 455/334, 550.1, 572
See application file for complete search history.

(56) References Cited

U.S. PATENT DOCUMENTS

| | | | | |
|---|---|---|---|---|
| 6,208,847 | B1 * | 3/2001 | Kosuga ........................ | 455/142 |
| 6,978,126 | B1 * | 12/2005 | Blaker et al. .................. | 455/352 |
| 8,010,048 | B2 | 8/2011 | Brommer et al. | |
| 8,099,069 | B2 * | 1/2012 | Kato ........................... | 455/193.3 |
| 2007/0249304 | A1 * | 10/2007 | Snelgrove et al. .......... | 455/127.2 |

(Continued)

FOREIGN PATENT DOCUMENTS

KR 10-2010-0063606 A 6/2010

OTHER PUBLICATIONS

S. Purcell et al., "Tuning of Nanotube Mechanical Resonances by Electric Field Pulling," *Physical Review Letters*, vol. 89, No. 27, Dec. 30, 2002, pp. 276103-1 to 276103-4, DOI: http://dx.doi.org/10.1103/PhysRevLett.89.276103.

(Continued)

*Primary Examiner* — Nhan Le
(74) *Attorney, Agent, or Firm* — NSIP Law

(57) ABSTRACT

A receiver for nano communication includes a power source including a cathode and an anode; a cathode unit connected to the cathode of the power source, the cathode unit including a nano device configured to receive a wireless signal modulated according to a predetermined modulation scheme, have at least two different resonant frequencies, and resonate based on a frequency of the wireless signal and the at least two different resonant frequencies; and an anode unit connected to the anode of the power source, the anode unit being configured to detect electrons emitted from the nano device, and demodulate a the wireless signal based on a pattern of the detected electrons.

23 Claims, 5 Drawing Sheets

(56) References Cited

U.S. PATENT DOCUMENTS

2009/0309676 A1  12/2009  Zettl et al.
2010/0144296 A1   6/2010  Burke et al.
2010/0271003 A1  10/2010  Jensen et al.

OTHER PUBLICATIONS

S. Perisanu et al.. "Electro-mechnics of Resonating Nanotubes and Nanowires in the Field Emission Environment," *International Journal of Nanotechnology*, vol. 7, No. 4/5/6/7/8, 2010, pp. 702-718, DOI: http://dx.doi.org/10.1504/IJNT.2010.031740 (pre-press version pp. 1-18 provided).

Extended European Search Report issued on Jun. 18, 2013, in counterpart European Patent Application No. 13155990.8 (7 pages, in English).

K. Jensen, J. Weldon, H. Garcia, and A. Zettl, "Nanotube Radio," *Nano Letters*, vol. 7, No. 11, pp. 3508-3511, published on the Web on Oct. 31, 2007.

C. E. Koksal and E. Ekici, "A nanoradio architecture for interacting nanonetworking tasks," *Nano Communication Networks*, vol. 1, No. 1, Mar. 2010, pp. 63-75.

C. E. Koksal, E. Ekici, and S. Rajan, "Design and analysis of systems based on RF receivers with multiple carbon nanotube antennas," *Nano Communication Networks*, vol. 1, No. 3, Sep. 2010, pp. 160-172.

Extended European Search Report issued Jul. 18, 2014 in counterpart European Patent Application No. 13155990.8 (8 pages in English).

\* cited by examiner

METHOD OF MODULATION AND DEMODULATION FOR NANO COMMUNICATION, AND RECEIVER USING THE METHOD

CROSS-REFERENCE TO RELATED APPLICATIONS

This application claims the benefit under 35 USC 119(a) of Korean Patent Application No. 10-2012-0019649 filed on Feb. 27, 2012, in the Korean Intellectual Property Office, the entire disclosure of which is incorporated herein by reference for all purposes.

BACKGROUND

1. Field

The following description relates to a method of modulation and demodulation for nano communication, and a receiver using the method.

2. Description of Related Art

Nanotube communication is based on a phenomenon in which a nanotube resonates at a predetermined frequency, and emits electrons while resonating. The nanotube may be a long cylindrical nanostructure having only one unique resonant frequency that depends on a radius of the nanotube and a length of the nanotube. A single nanotube may perform functions of an antenna, a tuner, an amplifier, and a demodulator in nanotube communication.

One end of the nanotube is connected to a cathode, and the other end of the nanotube opposes an anode, causing electrons to collect at the end of the nanotube opposing the anode and be emitted to the anode due to a field electron emission phenomenon to create a field-emission current. An incoming wireless signal interacts with the electrons at the end of the nanotube, causing a Lorentz force to be applied to the end of the nanotube. The Lorentz force tends to deflects the nanotube, but the deflection is resisted by the elasticity of the nanotube. If the frequency of the wireless signal is equal to the resonant frequency of the nanotube, the nanotube will resonate at the resonant frequency due to the interaction between the Lorentz force and the elasticity. Simultaneously, the electrons collected at the end of the nanotube are emitted to an anode as a field-emission current due to the field electron emission phenomenon discussed above. The number of electrons received at the anode is greater when the nanotube is resonating at the resonant frequency than when the nanotube is not resonating at the resonant frequency. Using this phenomenon, a wireless signal may be demodulated by distinguishing when the number of electrons received at the anode is above a predetermined threshold.

SUMMARY

In one general aspect, a receiver for nano communication includes a power source including a cathode and an anode; a cathode unit connected to the cathode of the power source, the cathode unit including a nano device configured to receive a wireless signal modulated according to a predetermined modulation scheme, have at least two different resonant frequencies, and resonate based on a frequency of the wireless signal and the at least two different resonant frequencies; and an anode unit connected to the anode of the power source, the anode unit being configured to detect electrons emitted from the nano device, and demodulate the wireless signal based on a pattern of the detected electrons.

The at least two different resonant frequencies may include a first resonant frequency and a second resonant frequency; and a resonant direction of the nano device at the first resonant frequency may be different from a resonant direction of the nano device at the second resonant frequency.

The at least two different resonant frequencies may depend on properties of the nano device; the properties of the nano device may include a length of the nano device, a width of the nano device, and a thickness of the nano device; the length of the nano device may be a longest dimension of the nano device; the width of the nano device may be a dimension of the nano device in a first direction of a cross section of the nano device, the cross section being orthogonal to the length of the nano device; the thickness of the nano device may be a dimension of the nano device in a second direction of the cross section of the nano device, the second direction being orthogonal to the first direction; and the width of the nano device may be different from the thickness of the nano device.

The wireless signal modulated according to the predetermined modulation scheme may be modulated based on the at least two different resonant frequencies.

The wireless signal modulated according to the predetermined modulation scheme may be modulated by mapping data bits to the at least two different resonant frequencies.

The anode unit may include an area corresponding to a resonant direction of the nano device, the area being configured to detect electrons emitted from the nano device; and the anode unit may be further configured to detect the pattern of the detected electrons based on the electrons detected by the area, and demodulate the wireless signal based on the detected pattern of the detected electrons.

The anode unit may include a plurality of areas corresponding to at least two resonant directions of the nano device; and the anode unit may be further configured to measure an amount of current flowing through each of the plurality of areas due to the detected electrons, compare the measured amounts of the currents with respective predetermined thresholds, detect the pattern of the detected electrons based on a result of the comparing, and demodulate the wireless signal based on the detected pattern of the detected electrons.

The nano device may include a nano belt having a structure of a rectangular column that is not a square column.

In another general aspect, a method of modulation for nano communication using a nano device having at least two different resonant frequencies includes providing data bits; identifying the at least two different resonant frequencies; and generating a wireless signal by modulating the data bits based on the at least two different resonant frequencies.

The generating of the wireless signal may include modulating the data bits by mapping the data bits to the at least two different resonant frequencies.

The at least two different resonant frequencies may include a first resonant frequency and a second resonant frequency; and a resonant direction of the nano device at the first resonant frequency may be different from a resonant direction of the nano device at the second resonant frequency.

The nano device may include a nano belt having a structure of a rectangular column that is not a square column.

In another general aspect, a method of demodulation for nano communication includes receiving a wireless signal modulated according to a predetermined modulation scheme with a nano device connected to a cathode of a power source; detecting electrons emitted from the nano device with a plurality of electronic sensors connected to an anode of the power source; and demodulating the wireless signal based on a pattern of the detected electrons; wherein the nano device may be configured to have at least two different resonant frequencies, and resonate based on a frequency of the wireless signal and the at least two different resonant frequencies.

The at least two different resonant frequencies may include a first resonant frequency and a second resonant frequency; and a resonant direction of the nano device at the first resonant frequency may be different from a resonant direction of the nano device at the second resonant frequency.

The wireless signal modulated according to the predetermined modulation scheme may modulated by mapping data bits to the at least two different resonant frequencies.

The demodulating of the wireless signal may include measuring an amount of current flowing through each of the electronic sensors due to the detected electrons; comparing the measured amounts of the currents with respective predetermined thresholds; and detecting the pattern of the detected electrons based on a result of the comparing; wherein the plurality of electronic sensors may include electronic sensors corresponding to at least two resonant directions of the nano device.

The nano device may include a nano belt having a structure of a rectangular column that is not a square column.

In another general aspect, a non-transitory computer-readable storage medium stores a program for controlling a computer to perform the method described above.

In another general aspect, a receiver for nano communication includes a cathode unit including a nano device, the nano device having a plurality of different resonant frequencies and being configured to receive a wireless signal; and an anode unit configured to detect a pattern of electrons emitted from the nano device while the nano device is receiving the wireless signal, and demodulate the wireless signal based on the detected pattern of the electrons emitted from the nano device.

The nano device may include a nano belt having a structure of a rectangular column that is not a square column.

The nano device may resonate in a plurality of different resonant directions respectively corresponding to the plurality of different resonant frequencies.

The wireless signal may be modulated according to a predetermined modulation scheme based on the plurality of resonant frequencies.

The predetermined modulation scheme maps a plurality of data bits to the plurality of resonant frequencies.

The anode unit may include a plurality of sensors configured to detect the electrons emitted from the nano device; and the anode unit may be further configured to measure an amount of current flowing through each of the sensors due to the detected electrons during a predetermined period of time, compare the measured amounts of the currents with respective predetermined thresholds, detect the pattern of the electrons emitted from the nano device based on a result of the comparing, and demodulate the wireless signal based on the detected pattern of the electrons emitted from the nano device.

The nano device may resonate in a plurality of different resonant directions respectively corresponding to the plurality of different resonant frequencies; and the plurality of sensors may include a plurality of sensors respectively corresponding to the plurality of different resonant directions; and a sensor corresponding to a combination of the plurality of different resonant directions.

The anode unit may include a plurality of sensors configured to detect the electrons emitted from the nano device; and the anode unit may be further configured to measure an amount of current flowing through each of the sensors due to the detected electrons during a predetermined period of time, obtain a sum value by summing up the measured amounts of the currents, compare the sum value of the measured amounts of the currents with a plurality of predetermined thresholds, compare two of the measured amounts of the currents with one another when the sum value of the measured amounts of the currents is between two of the predetermined threshold values, detect the pattern of the electrons emitted from the nano device based on a result of the two comparings, and demodulate the wireless signal based on the detected pattern of the electrons emitted from the nano device.

The nano device may resonate in a plurality of different resonant directions respectively corresponding to the plurality of different resonant frequencies; and the plurality of sensors may include a plurality of sensors respectively corresponding to the plurality of different resonant directions; a sensor corresponding to a combination of the plurality of different resonant directions; and a sensor corresponding to an area where the plurality of different resonant directions intersect.

Other features and aspects will be apparent from the following detailed description, the drawings, and the claims.

DETAILED DESCRIPTION

Figure 1:
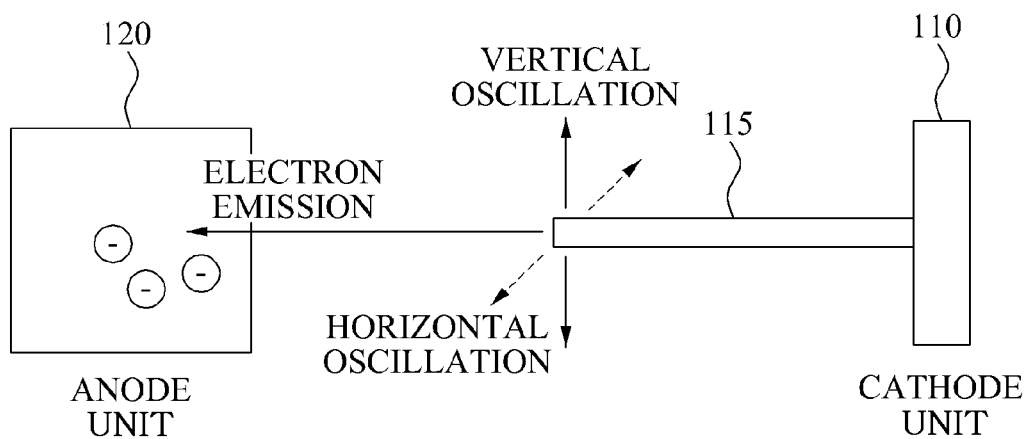
FIG. 1 is a diagram illustrating an example of a receiver for nano communication.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, description of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

FIG. 1 is a diagram illustrating an example of a receiver for nano communication. Referring to FIG. 1, the receiver includes a cathode unit 110 including a nano device 115, and an anode unit 120 configured to detect electrons emitted from the nano device 115. The cathode unit 110 is connected to a cathode of a power source, and the anode unit 120 is connected to an anode of the power source.

The nano device 115 has at least two different resonant frequencies that depend on properties of the nano device 115. For example, the nano device 115 may be a nano belt (not shown) having a structure of a rectangular column that is not a square column. In this example, the nano belt has two different resonant frequencies that depend on a length of the nano belt, a width of the nano belt, and a thickness of the nano belt.

The length of the nano belt is a longest dimension of the nano belt. The width of the nano belt is a dimension of the nano belt in a first direction of a cross section of the nano belt orthogonal to the length of the nano belt. The thickness of the nano belt is a dimension of the nano belt in a second direction of the cross section of the nano belt orthogonal to the first direction. The width of the nano belt and the thickness of the nano belt have different values. Accordingly, the nano belt has two different resonant frequencies corresponding to a width direction and a thickness direction, respectively.

The nano device 115 receives a wireless signal modulated according to a predetermined modulation scheme using the at least two different resonant frequencies of the nano device 115. In particular, the wireless signal is modulated by mapping data bits to the at least two different resonant frequencies to each other. The wireless signal is a signal generated by modulating a number of data bits equal to a number of the at least two different resonant frequencies.

For example, the data bits are matched to the at least two different resonant frequencies in a one-to-one correspondence. The data bits are modulated by determining whether a corresponding resonant frequency is to be included in the wireless signal based on whether a value of each of the data bits is '0' or '1'.

Furthermore, when a nano belt having a width and a thickness that are different from each other is used, the nano belt will have two different resonant frequencies. A wireless signal received by the nano belt is a signal generated by modulating two data bits using the two different resonant frequencies. That is, a first resonant frequency of the two different resonant frequencies corresponds to a first data bit of the two data bits, and a second resonant frequency of the two different resonant frequencies corresponds to a second data bit of the two data bits.

In this example, the first resonant frequency is not be included in the wireless signal when the first data bit has a value of '0,' and the first resonant frequency is included in the wireless signal when the first data bit has a value of '1,' causing the wireless signal to be modulated based on the value of the first data bit.

Similarly, the second resonant frequency is not be included in the wireless signal when the second data bit has a value of '0,' and the second resonant frequency is included in the wireless signal when the second data bit has a value of '1,' causing the wireless signal to be modulated based on the value of the second data bit.

The modulation scheme may be modified in various ways. For example, the first resonant frequency or the second resonant frequency may not be included in the wireless signal when the first data bit or the second data bit has a value of '1,' and the first resonant frequency or the second resonant frequency may be included in the wireless signal when the first data bit or the second data bit has a value of '0'.

Since four pieces of information may be indicated using two data bits, two data bits indicating the four pieces of information may be modulated by varying a combination of whether each of the first resonant frequency and the second resonant frequency is included in the wireless signal based on the values of the two data bits.

Whether the nano device 115 resonates depends on a frequency of the received wireless signal and the at least two different resonant frequencies of the nano device 115.

As described above, the at least two different resonant frequencies depend on the properties of the nano device 115. When the nano device 115 receives a wireless signal including at least one resonant frequency of the at least two different resonant frequencies as a frequency component, the nano device 115 will resonate at the at least one resonant frequency of the at least two different resonant frequencies.

In this example, the nano device 115 resonates in a different direction at each of the at least two different resonant frequencies. That is, the at least two different resonant frequencies may include a first resonant frequency and a second resonant frequency, and a resonant direction of the nano device 115 at the first resonant frequency is different from a resonant direction of the nano device 115 at the second resonant frequency.

For example, the nano belt having the width and the thickness that are different from each other will resonate in a width direction or a thickness direction depending on whether a resonant frequency corresponding to the width direction or a resonant frequency corresponding to the thickness direction is included in the received signal. In addition, when the signal received by the nano belt includes both the resonant frequency corresponding to the width direction and the resonant frequency corresponding to the thickness direction, the nano belt will resonate in both the width direction and the thickness direction.

The anode unit 120 detects electrons emitted from the nano device 115, and demodulates the wireless signal received by the nano device 115 based on a pattern of the detected electrons.

The anode unit 120 comprises a plurality of areas corresponding to at least two different resonant directions in which the nano device 115 may resonate. The areas detect electrons emitted from the nano device 115. The anode unit 120 detects the pattern of the detected electrons based on the electrons detected by the areas, and demodulates the wireless signal based on the pattern of the detected electrons.

In particular, the anode unit 120 detects the electrons emitted from the nano device 115, measures an amount of current flowing through each of the areas corresponding to the at least two resonant directions of the nano device 115 due to the detected electrons during a predetermined period of time, compares the measured amounts of the currents with predetermined thresholds, detects the pattern of the detected electrons based on a result of the comparing, and demodulates the wireless signal based on the detected pattern of the detected electrons. The anode unit 120 will be described in detail later with reference to FIGS. 3 and 4.

Figure 2:
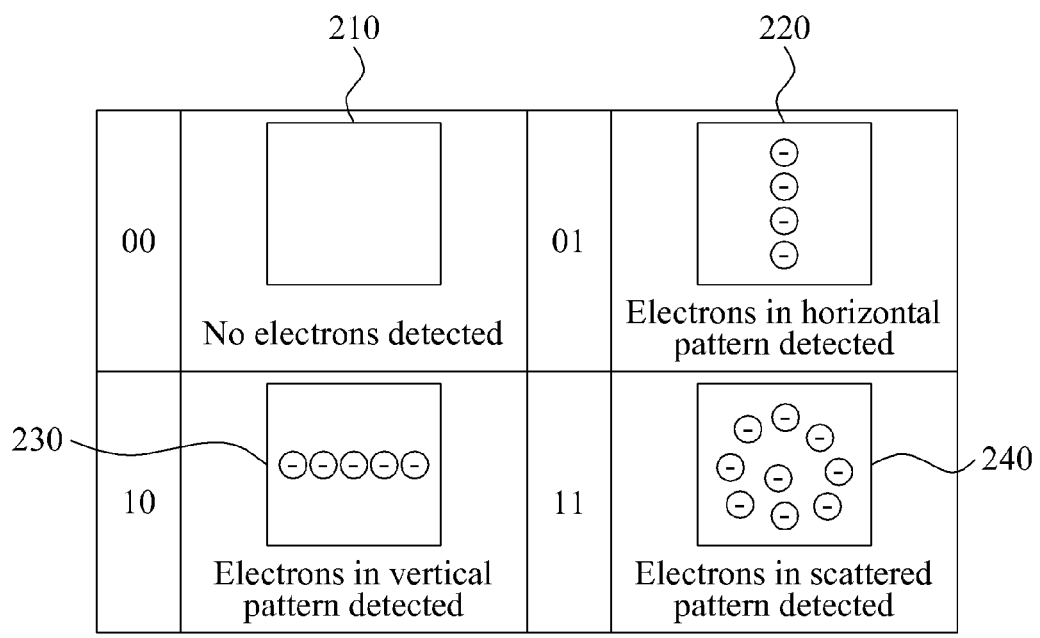
FIG. 2 is a diagram illustrating examples of patterns of electrons detected by an anode unit, and an example of a method of demodulating a wireless signal based on a pattern of the detected electrons.

FIG. 2 is a diagram illustrating examples of patterns of electrons detected by an anode unit, and an example of a method of demodulating a wireless signal based on a pattern of the detected electrons. Referring to FIG. 2, the anode unit demodulates a wireless signal received by a cathode unit based on the patterns of detected electrons.

In this example, a receiver for nano communication uses a nano belt having a structure of a rectangular column that is not a square column. The nano belt has two different resonant frequencies corresponding to a thickness and a width of the nano belt.

In this example, the nano belt resonates in a thickness direction and a width direction depending on frequency components of the received wireless signal. When a wireless signal including the two different resonant frequencies is received, the nano belt resonates in a shape of an ellipse or a circle depending on intensities of the two different resonant frequencies.

The anode unit demodulates the received wireless signal using the following method. The anode unit determines that '00' is transmitted when no electrons are detected as shown in 210. The anode unit determines that '01' is transmitted when the detected electrons detected have a vertical pattern as shown in 220. The anode unit determines that '10' is transmitted when the detected electrons have a horizontal pattern as shown in 230. The anode unit determines that '11' is transmitted when the detected electrons have a circular or elliptical pattern as shown in 240. Although FIG. 2 shows that no electrons are detected when '00' is transmitted, in fact there will be some electrons detected when '00' is transmitted because the nano belt will emit some electrons due to the field electron emission phenomenon discussed above. However, the number of these electrons is below a predetermined threshold for detecting electrons as will be described later, so for convenience of description, it will be assumed that no electrons are detected when '00' is transmitted.

In this example, the nano belt is disposed on the cathode unit so that the thickness direction and the width direction of the nano belt respectively correspond to a vertical direction and a horizontal direction. Alternatively, the nano belt may be disposed on the cathode unit so that the thickness direction and the width direction of the nano belt respectively correspond to the horizontal direction and the vertical direction.

The demodulation scheme described above may be modified in various ways depending on modifications of the modulation scheme described above with reference to FIG. 1. The descriptions provided with regard to the modification of the modulation scheme of the wireless signal may be applied identically to the modification of the demodulation scheme, and therefore detailed descriptions will be omitted for conciseness.

Figure 3:
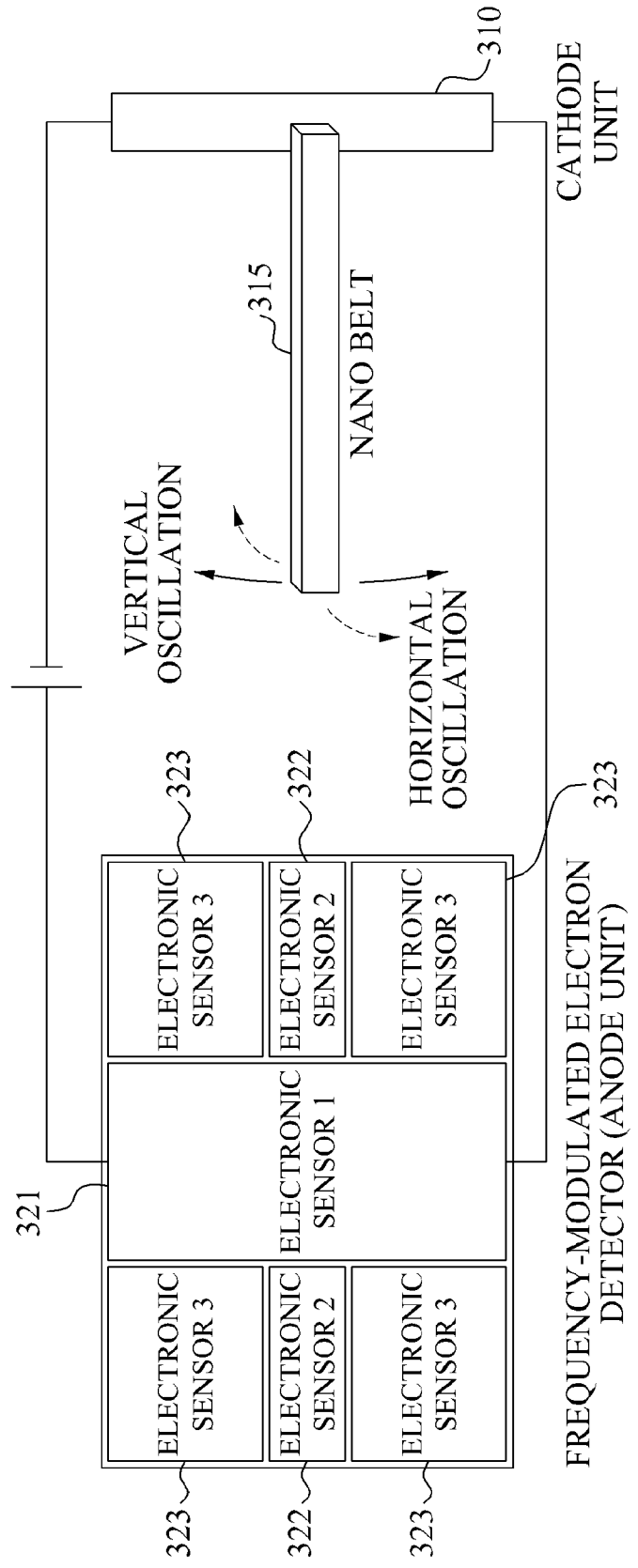
FIG. 3 is a diagram illustrating an example of a structure of an anode unit used for demodulating a wireless signal based on a pattern of detected electrons.

FIG. 3 is a diagram illustrating an example of a structure of an anode unit used for demodulating a wireless signal based on a pattern of detected electrons. Referring to FIG. 3, a receiver for nano communication includes a cathode unit 310 including a nano device 315, and an anode unit configured to detect electrons emitted from the nano device 315. In this example, the nano device 315 is a nano belt, and hereinafter will be referred to as the nano belt 315.

The nano belt 315 has a width and a thickness that are different from each other, causing the nano belt 315 to have two different resonant frequencies, and to resonate in a different direction at each of the two different resonant frequencies. In the example in FIG. 3, the nano belt 315 is disposed to resonate in a vertical direction and a horizontal direction depending on a frequency of a received wireless signal.

The anode unit has a two-dimensional (2D) planar structure. The anode unit includes a plurality of electronic sensors to detect the electrons emitted from the nano belt 315. The anode unit includes a first electronic sensor 321 in a vertical area of the 2D planar structure of the anode unit corresponding to a vertical oscillating area of the nano belt 315. The anode unit includes a second electronic sensor 322 in a horizontal area of the 2D planar structure of the anode unit corresponding to a horizontal oscillating area of the nano belt 315. The anode unit includes a third sensor 323 in a remaining area of the 2D planar structure of the anode unit that is unoccupied by the first electronic sensor 321 and the second electronic sensor 322.

Each of the first electronic sensor 321, the second electronic sensor 322, and the third electronic sensor 323 independently measures an amount of current received from the nano belt 315 connected to the cathode unit 310. The first electronic sensor 321, the second electronic sensor 322, and the third electronic sensor 323 may correspond to separate electrodes.

The receiver demodulates the received wireless signal using the first electronic sensor 321, the second electronic sensor 322, and the third electronic sensor 323 of the anode unit according to the demodulation scheme described above based on the following conditions:

$$\left.\begin{array}{l} \text{Electronic Sensor 1: } \int_{t-T}^{t}(\cdot)dt \geq TH_1 \to 01 \int_{t-T}^{t}(\cdot)d < TH_1 \\ \& \\ \text{Electronic Sensor 2: } \int_{t-T}^{t}(\cdot)dt \geq TH_2 \to 10 \int_{t-T}^{t}(\cdot)dt < TH_2 \\ \& \\ \text{Electronic Sensor 3: } \int_{t-T}^{t}(\cdot)dt \geq TH_3 \to 11 \int_{t-T}^{t}(\cdot)dt < TH_3 \end{array}\right\} \to 00$$

In particular, the first electronic sensor 321 receives emitted electrons from the nano belt 315, and measures an amount of current flowing due to the electrons received during a predetermined time period T as indicated by the expression $$\int_{t-T}^{t}(\cdot)$$

in the above conditions. The dot "•" in the parentheses in this expression denotes a number of the received electrons or an electrical charge of the received electrons. The receiver determines whether the measured amount of the current is greater than or equal to a first predetermined threshold $TH_1$, and demodulates the received wireless signal to '01' when it is determined that the measured amount of the current is greater than or equal to the first predetermined threshold $TH_1$. As one example, the receiver may measure the amount of current using a capacitor connected to the first electronic sensor 321 via a switch that is closed for the predetermined time T, and then opened so that the voltage of the capacitor represents the measured amount of the current. The receiver may compare the amount of the measured current with the predetermined threshold using a comparator having one input connected to the capacitor, and another input connected to a voltage representing the predetermined threshold. The capacitor may be discharged through another switch connected between the capacitor and ground that is closed after the comparing operation has been completed and opened before the next measuring operation is begun. However, this is merely an example, and many different ways of performing the measuring and comparing operations will be apparent to one of ordinary skill in the art.

The second electronic sensor 322 receives emitted electrons from the nano belt 315, and measures an amount of current flowing due to the electrons received during the predetermined time period T. The receiver determines whether the measured amount of the current is greater than or equal to a second predetermined threshold $TH_2$, and demodulates the received wireless signal to '10' when it is determined that the measured amount of the current is greater than or equal to the second predetermined threshold $TH_2$.

The third electronic sensor 323 receives emitted electrons from the nano belt 315, and measures an amount of current flowing due to the electrons received during the predetermined time period T. The receiver determines whether the measured amount of the current is greater than or equal to a third predetermined threshold $TH_3$, and demodulates the received wireless signal to '11' when it is determined that the measured amount of the current is greater than or equal to the third predetermined threshold $TH_3$.

When the receiver determines that the measured amounts of the currents measured by the first electronic sensor 321, the second electronic sensor 322, and the third electronic sensor 323 during the predetermined time period T are all less than the respective predetermined thresholds $TH_1$, $TH_2$, and $TH_3$, the receiver demodulates the received wireless signal to '00'.

Figure 4:
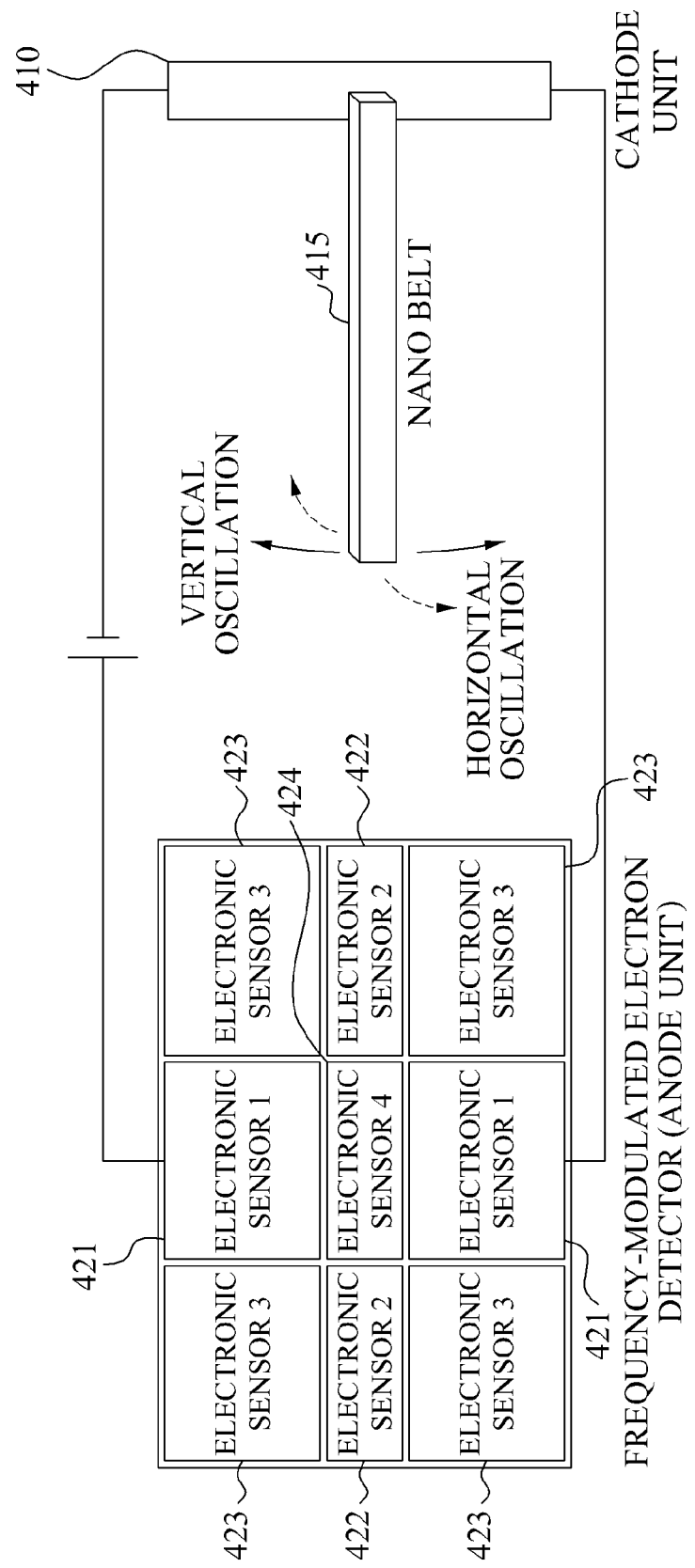
FIG. 4 is a diagram illustrating another example of a structure of an anode unit used for demodulating a wireless signal based on a pattern of detected electrons.

FIG. 4 is a diagram illustrating another example of a structure of an anode unit used for demodulating a wireless signal based on a pattern of detected electrons. Referring to FIG. 4, a receiver for nano communication includes a cathode unit 410 including a nano device 415, and an anode unit configured to detect electrons emitted from the nano device 415. In this example, the nano device 415 is a nano belt, and will be referred to as the nano belt 415.

The nano belt 415 has a width and a thickness that are different from each other, causing the nano belt 415 to have two different resonant frequencies, and to resonate in a different direction at each of the two different resonant frequencies. In the example in FIG. 3, the nano belt 415 is disposed to resonate in a vertical direction and a horizontal direction depending on a frequency of a received wireless signal.

The anode unit has a 2D planar structure. The anode unit includes a plurality of electronic sensors to detect the electrons emitted from the nano belt 415. The anode unit includes a first electronic sensor 421 in a vertical area of the 2D planar structure of the anode unit corresponding to a vertical oscillating area of the nano belt 415. The anode unit includes a second electronic sensor 422 in a horizontal area of the 2D planar structure of the anode unit corresponding to a horizontal oscillating area of the nano belt 415. The anode unit includes a fourth electronic sensor 424 in a central area of the 2D planar structure of the anode unit in which the vertical oscillating area and the horizontal oscillating area of the nano belt 415 overlap. The anode unit includes a third electronic sensor 423 in a remaining area of the 2D planar structure of the anode unit that is unoccupied by the first electronic sensor 421, the second electronic sensor 422, and the fourth electronic sensor 424.

Each of the first electronic sensor 421, the second electronic sensor 422, the third electronic sensor 423, and the fourth electronic sensor 424 independently measures an amount of current received from the nano belt 415 connected to the cathode unit 410. The first electronic sensor 421, the second electronic sensor 422, the third electronic sensor 423, and the fourth electronic sensor 424 may correspond to separate electrodes.

The receiver demodulates the received wireless signal using the first electronic sensor 421, the second electronic sensor 422, the third electronic sensor 423, and the fourth electronic sensor 424 of the anode unit according to the demodulation scheme described above based on the following conditions:

Electronic Sensor 1 + Electronic Sensor 2 + Electronic Sensor 3 + Electronic Sensor 4: $\int_{t-T}^{t} (\cdot) dt$

| 00 | 01 or 10 | 11 |
| --- | --- | --- |
| $TH_1$ | | $TH_2$ |

$\int_{t-T}^{t} (\cdot) dt$ in sensor 1 $>$ $\int_{t-T}^{t} (\cdot) dt$ in sensor 2 $\rightarrow$ 01

$\int_{t-T}^{t} (\cdot) dt$ in sensor 1 $\leq$ $\int_{t-T}^{t} (\cdot) dt$ in sensor 2 $\rightarrow$ 10

In particular, each of the first electronic sensor 421, the second electronic sensor 422, the third electronic sensor 423, and the fourth electronic sensor 424 receives emitted electrons from the nano belt 415, and measures an amount of current flowing due to the electrons received during a predetermined time period T as indicated by the expression $$\int_{t-T}^{t} (\cdot)$$

in the above conditions. The receiver demodulates the received wireless signal based on a sum value obtained by summing together the measured amounts of the currents measured by the first electronic sensor 421, the second electronic sensor 422, the third electronic sensor 423, and the fourth electronic sensor 424.

When the sum value is less than a first predetermined threshold $TH_1$, the receiver demodulates the received wireless signal to '00'.

When the sum value is greater than or equal to a second predetermined threshold $TH_2$, the receiver demodulates the received wireless signal to '11'.

When the sum value is greater than or equal to the first predetermined threshold $TH_1$ and less than the second predetermined threshold $TH_2$, the receiver compares the measured amount of the current measured by the first electronic sensor 421 with the measured amount of the current measured by the second electronic sensor 422. When the measured amount of the current measured by the first electronic sensor 421 is greater than the measured amount of the current measured by the second electronic sensor 422, the receiver demodulates the received wireless signal to '01'. Conversely, when the measured amount of the current measured by the second electronic sensor 422 is greater than the measured amount of the current measured by the first electronic sensor 421, the receiver demodulates the received wireless signal to '10'. A situation where the measured amount of the current measured by the first electronic sensor 421 is equal to the measured amount of the current measured by the second electronic sensor 422 would not be expected to occur when the sum value is greater than or equal to the first predetermined threshold $TH_1$ and less than the second predetermined threshold $TH_2$, assuming that the first predetermined threshold $TH_1$ and the second predetermined threshold $TH_2$ have been set properly. However, should such a situation occur, the receiver may report an error, or may demodulate the received wireless signal to '01', or may demodulate the received wireless signal to '10'.

In addition to the aforementioned scheme, the receiver may distinguish between '01' and '10' by various schemes. For example, the receiver may demodulate the received wireless signal to '01' when a sum of the measured amount of the current measured by the first electronic sensor 421 and the measured amount of the current measured by the fourth electronic sensor 424 is greater than or equal to a third predetermined threshold $TH_3$, and may demodulate the received wireless signal to '10' when a sum of the measured amount of the current measured by the second electronic sensor 422 and the measured amount of the current measured by the fourth electronic sensor 424 is greater than or equal to a fourth predetermined threshold $TH_4$.

Figure 5:
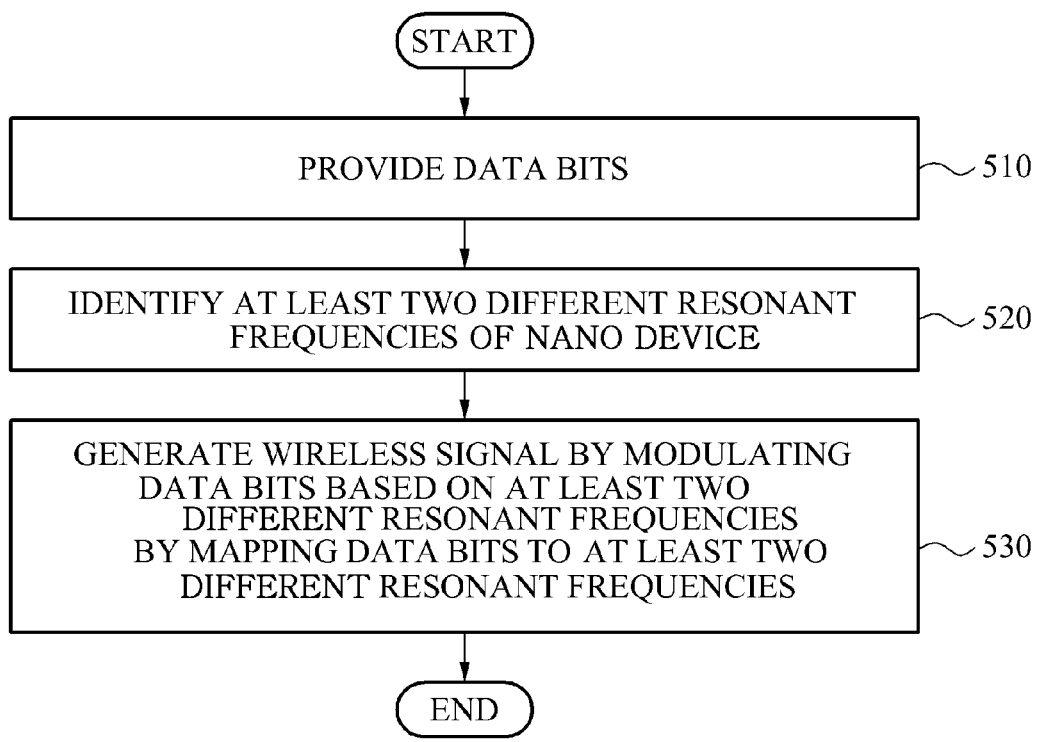
FIG. 5 is a flowchart illustrating an example of a method of modulation for nano communication.

FIG. 5 is a flowchart illustrating an example of a method of modulation for nano communication. Referring to FIG. 5, the modulation method includes providing data bits in 510, identifying at least two different resonant frequencies of a nano device in 520, and generating a wireless signal by modulating the data bits based on the at least two different resonant frequencies by mapping the data bits to the at least two different resonant frequencies in 530.

For example, the data bits may be matched to the at least two different resonant frequencies in a one-to-one correspondence. The wireless signal may be generated by determining whether a corresponding resonant frequency is to be included in the wireless signal based on whether a value of each of the data bits is '0' or '1'.

In this example, the nano device includes a nano belt having a structure of a rectangular column that is not a square column, and the at least two different resonant frequencies include a first resonant frequency and a second resonant frequency, and a resonant direction of the nano device at the first resonant frequency is different from a resonant direction of the nano device at the second resonant frequency.

The descriptions provided with reference to FIGS. 1 through 4 may be applied identically to the operations of FIG. 5, and therefore detailed descriptions will be omitted for conciseness.

Figure 6:
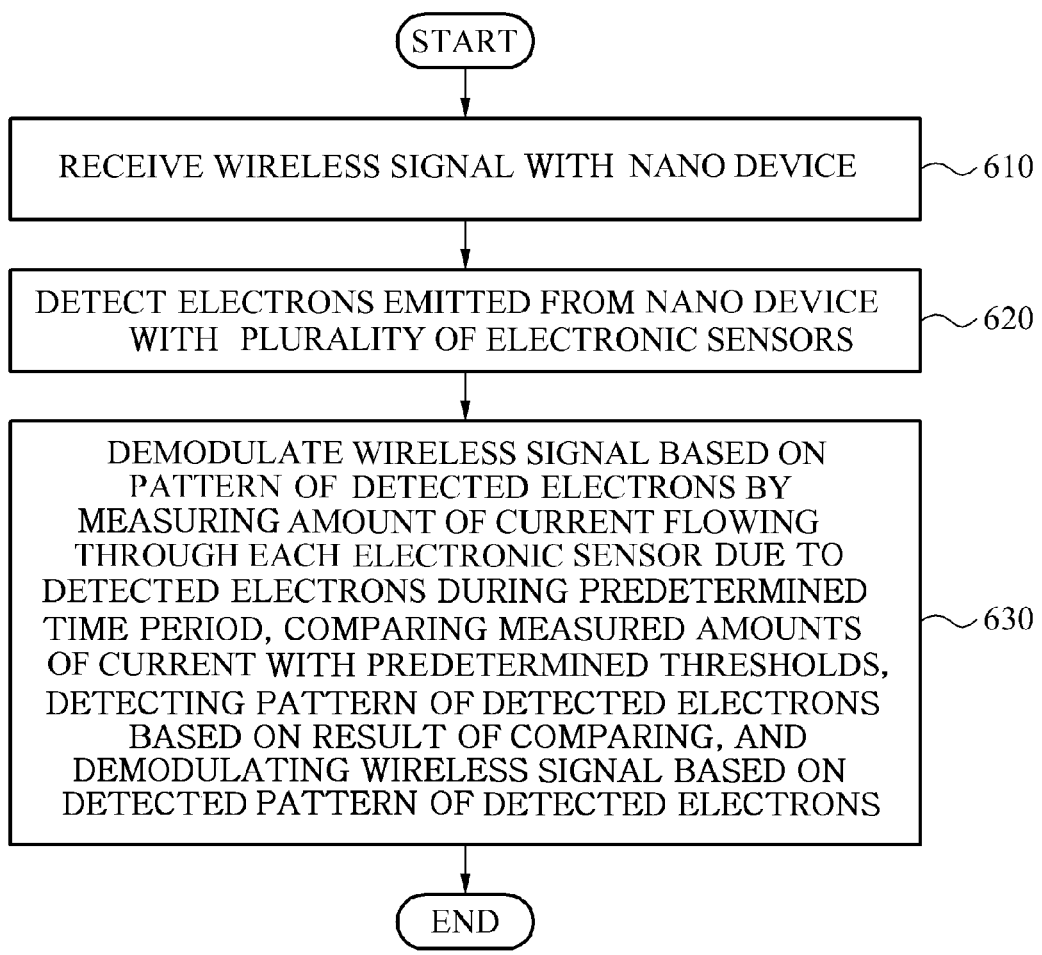
FIG. 6 is a flowchart illustrating an example of a method of demodulation for nano communication.

FIG. 6 is a flowchart illustrating an example of a method of demodulation for nano communication. Referring to FIG. 6, the demodulation method includes receiving a wireless signal using a nano device in 610, detecting electrons emitted from the nano device using a plurality of electronic sensors in 620, and demodulating the received wireless signal based on a pattern of the detected electrons by measuring an amount of a current flowing through each of the electronic sensors due to the detected electrons during a predetermined time period, comparing the measured amounts of the currents with predetermined thresholds, detecting a pattern of the detected electrons based on result of the comparing, and demodulating the wireless signal based on the detected pattern of the detected electrons in 630.

In this example, the nano device includes a nano belt having a structure of a rectangular column that is not a square column, is connected to a cathode of a power source, has at least two different resonant frequencies, and resonates based on a frequency of the received wireless signal and the at least two different resonant frequencies. The at least two different resonant frequencies include a first resonant frequency and a second resonant frequency, and a resonant direction of the nano device at the first resonant frequency is different from a resonant direction of the nano device at the second resonant frequency. The plurality of electronic sensors include electronic sensors corresponding to the resonant directions of the nano device.

The wireless signal is a signal modulated according to a predetermined modulation scheme. In particular, the wireless signal is a signal modulated by mapping data bits to the at least two different resonant frequencies.

The descriptions provided with reference to FIGS. 1 through 4 may be applied identically to the operations of FIG. 6, and therefore detailed descriptions will be omitted for conciseness.

The receiver for nano communication described above may be implemented using one or more hardware components, one or more software components, or a combination of one or more hardware components and one or more software components.

A hardware component may be, for example, a physical device that physically performs one or more operations, but is not limited thereto. Examples of hardware components include amplifiers, low-pass filters, high-pass filters, band-pass filters, analog-to-digital converters, digital-to-analog converters, comparators, capacitors, switches, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A receiver for nano communication, the receiver comprising:
a power source comprising a cathode and an anode;
a cathode unit connected to the cathode of the power source, the cathode unit comprising a nano device configured to:
receive a wireless signal modulated according to a predetermined modulation scheme;
have at least two different resonant frequencies; and
resonate based on a frequency of the wireless signal and the at least two different resonant frequencies; and
an anode unit connected to the anode of the power source, the anode unit being configured to:
detect electrons emitted from the nano device; and
demodulate the wireless signal based on a pattern of the detected electrons.

2. The receiver of claim 1, wherein the at least two different resonant frequencies comprise a first resonant frequency and a second resonant frequency; and
a resonant direction of the nano device at the first resonant frequency is different from a resonant direction of the nano device at the second resonant frequency.

3. The receiver of claim 1, wherein the at least two different resonant frequencies depend on properties of the nano device;
the properties of the nano device comprise a length of the nano device, a width of the nano device, and a thickness of the nano device;
the length of the nano device is a longest dimension of the nano device;
the width of the nano device is a dimension of the nano device in a first direction of a cross section of the nano device, the cross section being orthogonal to the length of the nano device;
the thickness of the nano device is a dimension of the nano device in a second direction of the cross section of the nano device, the second direction being orthogonal to the first direction; and
the width of the nano device is different from the thickness of the nano device.

4. The receiver of claim 1, wherein the wireless signal modulated according to the predetermined modulation scheme is modulated based on the at least two different resonant frequencies.

5. The receiver of claim 4, wherein the wireless signal modulated according to the predetermined modulation scheme is modulated by mapping data bits to the at least two different resonant frequencies.

6. The receiver of claim 1, wherein the anode unit comprises an area corresponding to a resonant direction of the nano device, the area being configured to detect electrons emitted from the nano device; and
the anode unit is further configured to:
detect the pattern of the detected electrons based on the electrons detected by the area; and
demodulate the wireless signal based on the detected pattern of the detected electrons.

7. The receiver of claim 1, wherein the anode unit comprises a plurality of areas corresponding to at least two resonant directions of the nano device; and
the anode unit is further configured to:
measure an amount of current flowing through each of the plurality of areas due to the detected electrons;
compare the measured amounts of the currents with respective predetermined thresholds;
detect the pattern of the detected electrons based on a result of the comparing; and demodulate the wireless signal based on the detected pattern of the detected electrons.

8. The receiver of claim 1, wherein the nano device comprises a nano belt having a structure of a rectangular column that is not a square column.

9. A method of demodulation for nano communication, the method comprising:
  receiving a wireless signal modulated according to a predetermined modulation scheme with a nano device connected to a cathode of a power source;
  detecting electrons emitted from the nano device with a plurality of electronic sensors connected to an anode of the power source; and
  demodulating the wireless signal based on a pattern of the detected electrons;
  wherein the nano device is configured to:
    have at least two different resonant frequencies; and
    resonate based on a frequency of the wireless signal and the at least two different resonant frequencies.

10. The method of claim 9, wherein the at least two different resonant frequencies comprise a first resonant frequency and a second resonant frequency; and
  a resonant direction of the nano device at the first resonant frequency is different from a resonant direction of the nano device at the second resonant frequency.

11. The method of claim 9, wherein the wireless signal modulated according to the predetermined modulation scheme is modulated by mapping data bits to the at least two different resonant frequencies.

12. The method of claim 9, wherein the demodulating of the wireless signal comprises:
  measuring an amount of current flowing through each of the electronic sensors due to the detected electrons;
  comparing the measured amounts of the currents with respective predetermined thresholds; and
  detecting the pattern of the detected electrons based on a result of the comparing;
  wherein the plurality of electronic sensors comprise electronic sensors corresponding to at least two resonant directions of the nano device.

13. The method of claim 9, wherein the nano device comprises a nano belt having a structure of a rectangular column that is not a square column.

14. A non-transitory computer-readable storage medium storing a program for controlling a computer to perform the method of claim 9.

15. A receiver for nano communication, the receiver comprising:
  a cathode unit comprising a nano device, the nano device having a plurality of different resonant frequencies and being configured to receive a wireless signal; and
  an anode unit configured to:
    detect a pattern of electrons emitted from the nano device while the nano device is receiving the wireless signal; and
    demodulate the wireless signal based on the detected pattern of the electrons emitted from the nano device.

16. The receiver of claim 15, wherein the nano device comprises a nano belt having a structure of a rectangular column that is not a square column.

17. The receiver of claim 15, wherein the nano device resonates in a plurality of different resonant directions respectively corresponding to the plurality of different resonant frequencies.

18. The receiver of claim 15, wherein the wireless signal is modulated according to a predetermined modulation scheme based on the plurality of resonant frequencies.

19. The receiver of claim 15, wherein the predetermined modulation scheme maps a plurality of data bits to the plurality of resonant frequencies.

20. The receiver of claim 15, wherein the anode unit comprises a plurality of sensors configured to detect the electrons emitted from the nano device; and
  the anode unit is further configured to:
    measure an amount of current flowing through each of the sensors due to the detected electrons during a predetermined period of time;
    compare the measured amounts of the currents with respective predetermined thresholds;
    detect the pattern of the electrons emitted from the nano device based on a result of the comparing; and
    demodulate the wireless signal based on the detected pattern of the electrons emitted from the nano device.

21. The receiver of claim 20, wherein the nano device resonates in a plurality of different resonant directions respectively corresponding to the plurality of different resonant frequencies; and
  the plurality of sensors comprise:
    a plurality of sensors respectively corresponding to the plurality of different resonant directions; and
    a sensor corresponding to a combination of the plurality of different resonant directions.

22. The receiver of claim 15, wherein the anode unit comprises a plurality of sensors configured to detect the electrons emitted from the nano device; and
  the anode unit is further configured to:
    measure an amount of current flowing through each of the sensors due to the detected electrons during a predetermined period of time;
    obtain a sum value by summing up the measured amounts of the currents;
    compare the sum value of the measured amounts of the currents with a plurality of predetermined thresholds;
    compare two of the measured amounts of the currents with one another when the sum value of the measured amounts of the currents is between two of the predetermined threshold values;
    detect the pattern of the electrons emitted from the nano device based on a result of the two comparings; and
    demodulate the wireless signal based on the detected pattern of the electrons emitted from the nano device.

23. The receiver of claim 22, wherein the nano device resonates in a plurality of different resonant directions respectively corresponding to the plurality of different resonant frequencies; and
  the plurality of sensors comprise:
    a plurality of sensors respectively corresponding to the plurality of different resonant directions;
    a sensor corresponding to a combination of the plurality of different resonant directions; and
    a sensor corresponding to an area where the plurality of different resonant directions intersect.

* * * * *